Inventor
Anthony S. Coleman
Hubert R. Holland
By
Holcombe, Wetherill & Brisebois
Attorneys United States Patent Office 3,056,075
Patented Sept. 25, 1962

3,056,075
TURRET TUNERS
Anthony S. Coleman and Hubert Roy Holland, Ascot, England, assignors to Brayhead (Ascot) Limited, Ascot, England, a British company
Filed Nov. 4, 1958, Ser. No. 771,759
Claims priority, application Great Britain Nov. 7, 1957
3 Claims. (Cl. 317—249)

Figure 1:
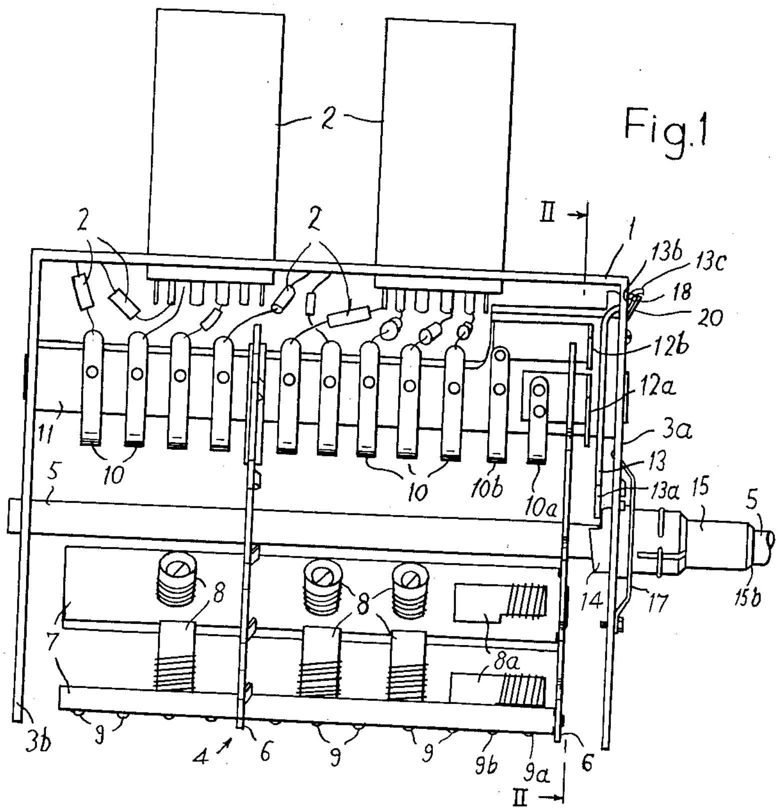

The present invention relates to turret tuners as used in television receivers and other high frequency radio apparatus, in which a plurality of different groups of tuned circuits covering different frequency ranges or "channels" are mounted on a rotatable turret which is turnable to different positions selectively to connect the different groups of tuned circuits, representing the different frequency ranges into operative relation with the remainder of the circuit of the television receiver or other apparatus.

Such tuners also incorporate a fine tuning condenser for making a fine tuning adjustment to the required frequency within the channel selected by the position of the turret. This fine tuning condenser is common to all channels and consequently covers a wider range of adjustment as the channel frequency increases.

The present invention has for its object to provide a fine tuning arrangement for turret tuners which enables the fine tuning range to be selectively changed in accordance with the selected channel. By means of the invention it becomes possible to provide substantially equal fine tuner range over the different channels, or to provide an increased fine tuner range in a lower frequency channel if this should be required.

The invention consists in a turret tuner having a fine tuning arrangement comprising a plurality of electrical condensers operable simultaneously by a common control member, and switching means for selectively connecting said condensers either individually or in different combinations or arrays, in the tuning circuit depending upon the frequency channel to which the turret tuner is adjusted.

According to a feature of the invention, the condensers have one common electrode which is moved, when the control means is actuated, relative to a plurality of counter electrodes individual to the different condensers. These counter electrodes connect with contacts on the side contact bar of the tuner which are adapted to engage with contacts on the insulating wafers or the like on the rotatable turret which carry the circuit tuning components of the different channels, the tuning components on the different wafers being so connected to the wafer contacts that the appropriate counter electrode or electrodes will be connected in the tuning circuit corresponding to the frequency channel of the tuning components of the wafer which is in the contact-engaging position.

According to a further feature of the invention, the condenser counter electrodes are mounted on the side contact bar and are preferably provided with conducting portions which directly engage the associated spring contacts. The counter electrodes may comprise flat plate members arranged side-by-side in approximately the same plane, the movable electrode also comprising a flat plate arranged facing both counter electrodes and movable towards and away therefrom. The common plate may be mounted for swinging movement, being actuated in one direction by a cam against the action of a spring which moves the plate in the opposite direction as the cam is moved back to its initial position. The cam may be provided on or actuated by a sleeve rotatable on the turret spindle. The sleeve may be rotated back and forth by a control knob to adjust the fine tuner.

The flat plate members constituting the counter electrodes may be of different areas. For fine tuning on one channel, for example Band III (i.e. 174–216 mc./s.) only one plate is connected in the tuning circuit, whereas for a lower frequency channel, for example Band I (i.e. 41–68 mc./s.), two counter electrodes may be connected together to form two parallel connected condensers in the tuning circuit. By appropriate dimensioning of the counter electrodes, approximately the same fine tuning frequency range can be provided for both channels with full movement of the fine tuner control.

In frequency bands where a wide range of tuning is desirable, for example in Band II (i.e. 87.5–100 mc./s.) where it is desirable that all stations in the band may be covered by the movement of the control knob of the fine tuner, the condensers may be approprately selected or connected to achieve this end. For example if two counter electrodes are connected to opposite ends of the oscillator coil, the common electrode being connected to earth, an appropriately wide range of variation can be achieved.

From another aspect the invention consists in a turret tuner having a fine tuning arrangement actuated by a control knob rotatable between two limits, wherein full rotation of the knob produces approximately the same range of frequency variation when the turret is adjusted to either of at least two different frequency bands.

Figure 2:
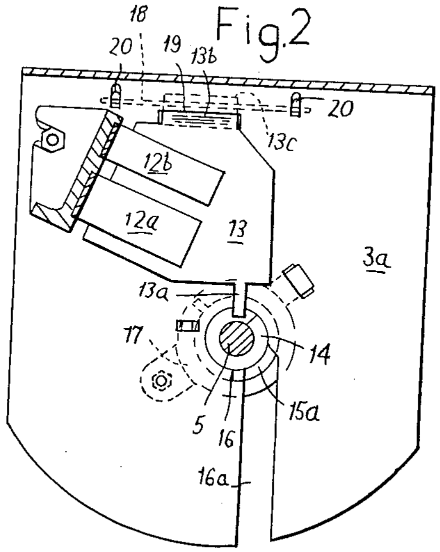
Figure 3:
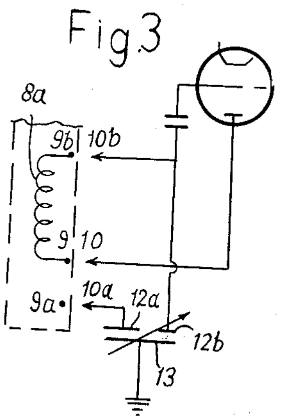

In order that the invention may be more fully understood, reference will now be made to the accompanying drawings, in which:

FIGURE 1 is a side elevation of a turret tuner incorporating one embodiment of fine tuning arrangement according to this invention, FIGURE 2 is a view along the line II—II in FIGURE 1 taken in the direction of the arrows, FIGURE 3 is an explanatory circuit diagram.

Referring to FIGURES 1 and 2, the turret tuner comprises a chasses 1 carrying the valves and other components of the tuner generally indicated at 2 and provided with two spaced end plates *3a*, *3b* which form supports and bearings for the rotatable coil turret generally indicated at 4. The turret consists of a rotatable spindle 5 carrying spaced support sections 6 on which are mounted a series of wafers 7, one for each of the fregency ranges or channels to which the tuner can be tuned. Each wafer carries a plurality of coils 8 connected to fixed contacts 9 on the wafer which are selectively connectable with contacts 10 carried by the fixed side contact bar 11 of the tuner when that wafer is switched into operative position. The contacts 10 on the side contact bar 11 are in turn connected to the valves and the remainder of the circuitry of the tuner. In the drawing only two wafers 7 have been shown for the sake of clarity, but it will be understood that in practice successive wafers may be arranged closely adjacent to each other if desired.

According to the present invention, a fine tuning arrangement is provided which consists of two condensers constituted by a common movable plate member and two separate fixed plate members or counter electrodes. The two counter electrodes 12*a*, 12*b* of strip-like form are mounted on the side contact bar 11 so as to face but be spaced from the front end plate *3a* of the supporting frame of the tuner. Pivotably mounted on this end plate *3a* is the common movable electrode 13 which is formed with a projecting finger 13*a* adapted to engage with a cam surface 14 formed on the inner end face of a sleeve 15, preferably of insulating material such as nylon, which surrounds the turret spindle 5 and is rotatably mounted in the end plate *3a*. The sleeve may be provided with an annular groove 15*a* therearound, or with an enlarged head at its inner end, to locate the sleeve 15 relative to the bearing aperture in the end plate 3*a*. The sleeve 15 may be inserted into the bearing aperture 16 in the end plate 3*a* by passing it sideways through a slot 16*a* extending from the bearing aperture 16 to the edge of the end plate, and be retained in the bearing aperture by a locking member 17 secured to the end plate 3*a*. The sleeve may be provided with means for attaching an operating knob at its outer end 15*b*, the operating knob for the turret being mounted on the end of the spindle 5 which projects through the sleeve.

The common electrode 13 is urged by a spring 18 towards the end wall so that the finger 13*a* is held in contact with the cam surface on the sleeve. Thus the common electrode 13 is a metal plate which is pivoted to the end wall by bending an edge zone of the plate into a Z-like step 13*b*, this edge zone being passed through a bearing slot 19 in the end wall with the intermediate portion of the step forming a bearing member and the marginal portion 13*c* inclining away from the outer surface of the end wall. The wire spring 18 engages beneath lugs 20 struck up from the end wall and extends over the marginal portion to urge it towards the outer surface of the end plate 3*a*, thereby tending to pivot the electrode 13 away from the counter electrodes 12*a*, 12*b* and hold the finger 13*a* in contact with the cam 14. By rotating the sleeve 15, the common electrode 13 is moved towards or away from the counter electrodes 12*a*, 12*b*. The cam surface may be non-linear.

The ends of the counter electrodes 12*a*, 12*b* which are secured to the contact bar are folded over at a right angle to form feet which are secured to the side contact bar 11 by rivets or screws. The counter electrodes are also secured to the spring contact fingers 10*a*, 10*b* which are adapted to be engaged by contacts 9*a*, 9*b* on the wafers as the turret is turned. The feet of the counter electrodes generally extend side-by-side in the longitudinal direction of the side contact bar, and the foot of the counter electrode 12*b* located remote from the edge of the contact bar, from which the spring contacts 10 project is made longer than the foot of the other counter electrode 12*a* and is also L-shaped so that it extends to a position behind the foot of said other counter electrode where its spring contact finger 10*b* is secured alongside the spring contact finger 10*a* of said other counter electrode. As mentioned above, the insulating wafers 7 on the turret drum which carry the coil assemblies 8 corresponding to the different frequency channels to which the tuner is to be adjusted are provided with contacts generally indicated at 9 to connect with the spring contact fingers 10 on the side contact bar as the turret is turned. The coil which is to be associated with the fine tuning arrangement, for example the oscillator coil 8*a*, is connected to contacts on the associated wafer which are so positioned that the appropriate fine tuning condenser or condensers will be connected in circuit for that particular coil. For example as shown in the FIGURE 3, in which 10, 10*a* and 10*b* represent three spring contact fingers on the side contact bar, the two counter electrodes 12*a*, 12*b* are connected respectively to the contact fingers 10*a*, 10*b*, the common electrode 13 being connected to earth. 7 represents a wafer on the turret drum carrying contacts 9, 9*a* and 9*b* adapted to engage respectively with the contact fingers 10, 10*a* and 10*b* when that wafer is in the operative position. By connecting the coil 8*a* on this wafer across the contacts 9 and 9*b*, the condenser constituted by the counter electrode 12*b* and the common electrode 13 will be connected in the tuning circuit. By additionally connecting the contacts 9*a* and 9*b* together, both condensers constituted by the counter electrode 12*a* and 12*b* and the common electrode 13 will be connected in parallel in the tuning circuit. Alternatively by connecting the contacts 9 and 9*a* together, one of the condensers will be connected to one end of the coil and the other condenser to the other end of the coil.

By making the counter electrode 12*b* smaller than counter electrode 12*a*, it can be arranged for the fine tuner to achieve a frequency variation of 2 to 2½ megacycles both when the tuner is adjusted for Band III (i.e. 174–216 mc./s.) operation and only condenser 12*b* is connected, or for Band I (i.e. 41–68 mc./s.) operation when condensers 12*a* and 12*b* are contacted in parallel. For Band II (i.e. 87.5–100 mc./s.) operation, by connecting the electrodes 12*a* and 12*b* to opposite ends of the coil, the fine tuner can produce a frequency variation of about 8 megacycles which is sufficient to cover a range from 88 to 96 megacycles within which all the existing V.H.F. transmitters on Band II are located, so that all stations in this band can be tuned by the fine tuner.

The sleeve 15 which carries cam 14 for actuating the fine tuner also provides a larger bearing surface for the turret spindle 5 which is rotatable therein.

Whilst a particular embodiment has been described, it will be understood that various modifications may be made without departing from the scope of the invention.

We claim:

1. A fine tuning arrangement for V.H.F. frequencies comprising a plurality of electrical condensers, said condensers consisting of a plurality of fixed plates side-by-side in the same plane and a common movable plate opposite said fixed plates, a supporting wall member arranged generally parallel to said plates and having a slot, said movable plate, which is located between said fixed plates and said supporting wall member, having an edge zone formed as a substantially Z-shaped portion engaging through said slot with the central part of the Z bearing against an edge of the slot, a finger on an opposite edge of said movable plate, a rotatable cam engaged by said finger, a spring member on the opposite side of said supporting wall member to said fixed and movable plates and bearing against the free end of said Z-shaped portion to urge said finger into engagement with said cam, whereby rotation of said cam causes said movable plate to pivot relative to said supporting wall portion and move towards or away from said fixed plates depending upon the direction of rotation of said cam.

2. A fine tuning arrangement for V.H.F. frequencies comprising a plurality of electrical condensers, said condensers consisting of a plurality of fixed plates side-by-side in the same plane and a common movable plate opposite said fixed plates, a supporting wall member arranged generally parallel to said plates and having a slot, said movable plate, which is located between said fixed plates and said supporting wall member, having an edge zone formed as a substantially Z-shaped portion engaging through said slot with the central part of the Z bearing against an edge of the slot, a rotatable cam engaged by the opposite edge of said movable plate, a spring member on the opposite side from said supporting wall member to said fixed and movable plates and bearing against the free end of said Z-shaped portion to urge said movable plate into engagement with said cam, whereby rotation of said cam causes said movable plate to pivot relative to said supporting wall portion and move towards or away from said fixed plates depending upon the direction of rotation of said cam.

3. A fine tuning arrangement for V.H.F. frequencies comprising a plurality of electrical condensers, said condensers consisting of two fixed plates side-by-side in the same plane and each having a different surface area and a common movable plate opposite said fixed plates, a supporting wall member arranged generally parallel to said plates and having a slot, said movable plate, which is located between said fixed plates and said supporting wall member, having an edge zone formed as a substantially Z-shaped portion engaging through said slot with the central part of the Z bearing against an edge of the slot, a finger on an opposite edge of said movable plate, a rotatable cam engaged by said finger, a spring member on the opposite side of said supporting wall member to said fixed and movable plates and bearing against the free end of said Z-shaped portion to urge said finger into engagement with said cam, whereby rotation of said cam causes said movable plate to pivot relative to said supporting wall portion and move towards or away from said fixed plates depending upon the direction of rotation of said cam, a contact strip carrying contacts for connecting said condensers into operable relation with a circuit and means for mounting said fixed plates on said contact strip and directly connected each to one of said contacts.

References Cited in the file of this patent

UNITED STATES PATENTS

| | | |
|---|---|---|
| 1,608,922 | Bockins | Nov. 30, 1926 |
| 1,616,093 | Stein | Feb. 1, 1927 |
| 1,625,234 | Wittgenstein | Apr. 19, 1927 |
| 2,562,263 | Ehrlich | July 31, 1951 |
| 2,585,844 | Romero | Feb. 12, 1952 |
| 2,589,351 | Ehrlich | Mar. 18, 1952 |
| 2,755,386 | Thias | July 17, 1956 |
| 2,776,376 | Slate | Jan. 1, 1957 |
| 2,791,124 | Gossard | May 7, 1957 |
| 2,864,946 | Achenbach | Dec. 16, 1958 |
| 2,913,683 | Mason | Nov. 17, 1959 |
| 2,922,881 | Frey | Jan. 26, 1960 |